(12) United States Patent
Desrosiers et al.

(10) Patent No.: US 7,471,517 B1
(45) Date of Patent: Dec. 30, 2008

(54) HEAT SINK RETENTION MODULE HAVING FORCE-ADJUSTABLE WIRE MODULES

(75) Inventors: Norman Bruce Desrosiers, Oxford, NC (US); Michael Dudley French, Jr., Raleigh, NC (US); Dean Frederick Herring, Youngsville, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/843,413

(22) Filed: Aug. 22, 2007

(51) Int. Cl.
*H05K 7/20* (2006.01)
*H01L 23/34* (2006.01)
*F28F 7/00* (2006.01)

(52) U.S. Cl. ............ 361/719; 165/80.3; 165/185; 257/719; 361/704; 361/710

(58) Field of Classification Search .......... 257/719; 361/719
See application file for complete search history.

(56) References Cited

U.S. PATENT DOCUMENTS

| | | | |
|---|---|---|---|
| 5,448,449 A * | 9/1995 | Bright et al. ............ | 361/704 |
| 5,493,475 A * | 2/1996 | Lin ....................... | 361/710 |
| 5,544,013 A | 8/1996 | Chiou | |
| 5,671,118 A | 9/1997 | Blomquist | |
| 5,678,627 A * | 10/1997 | Lee ....................... | 165/80.3 |
| 6,618,253 B1 | 9/2003 | Szu et al. | |
| 6,648,664 B1 | 11/2003 | McHugh et al. | |
| 6,678,160 B1 | 1/2004 | Liu | |
| 6,707,672 B2 | 3/2004 | Liu | |
| 6,768,641 B2 * | 7/2004 | Li ........................ | 361/719 |
| 6,904,650 B2 * | 6/2005 | Chen et al. ............ | 24/517 |
| 7,102,889 B1 | 9/2006 | Barsun | |
| 7,142,430 B2 * | 11/2006 | Lee et al. ............. | 361/719 |
| 7,236,369 B2 | 6/2007 | Barina et al. | |
| 7,283,361 B2 * | 10/2007 | Lee et al. ............. | 361/704 |
| 7,385,825 B2 * | 6/2008 | Xia et al. ............. | 361/719 |
| 7,385,826 B2 * | 6/2008 | Barina et al. ........ | 361/719 |
| 2003/0214787 A1 * | 11/2003 | Liu ....................... | 361/704 |
| 2005/0174739 A1 * | 8/2005 | Chen et al. ............ | 361/704 |
| 2006/0133038 A1 * | 6/2006 | Yu et al. ............... | 361/697 |
| 2007/0103870 A1 * | 5/2007 | Li et al. ................. | 361/704 |

OTHER PUBLICATIONS

V.N Egorov; V.L. Masalov; Yu. A. Nefyodov; A.F. Shevchun; and M.R. Trunin; Measuring Microwave Properties of Laminated Dielectric Substrates, Review of Scientific Instruments, Nov. 2004, vol. 75—Issue 11, American Institute of Physics.

* cited by examiner

*Primary Examiner*—Gregory D Thompson
(74) *Attorney, Agent, or Firm*—Cynthia Byrd; Jeffrey L. Streets

(57) ABSTRACT

A heat sink retention module including a frame, first and second wire modules and a latch. The frame receives a heat sink base and is securable to a circuit board. First and second wire modules each include a pair of arm sections pivotally coupled to opposing sides of the frame about a transverse axis, a transverse handle section, and a spring clip formed adjacent the pivoting end of each arm section. The transverse axis of the first wire module is longitudinally spaced apart from the transverse axis of the second wire module. When the wire modules are adducted and flexed, a generally downward force is applied to the heat sink base by the spring clips, which extend generally perpendicular to each arm section. The wire modules are kept in the adducted position by a latch selectively securable between the transverse handle sections of the first and second wire modules.

16 Claims, 4 Drawing Sheets

HEAT SINK RETENTION MODULE HAVING FORCE-ADJUSTABLE WIRE MODULES

BACKGROUND OF THE INVENTION

1. Field of the Invention

The present invention relates to a method and apparatus for securing a heat sink above a processor installed in a computer.

2. Description of the Related Art

Heat sinks are a vital part of any computer system. The heat generated by continued and extended use of a computer can severely damage the electrical components in the computer. Heat sinks provide a way for the heat to be transferred away from the source and away from critical components. To increase the amount of thermal transfer, heat sinks typically include a large surface area or a large number of thermally conductive fins. Furthermore, heat sinks are typically secured to the computer chassis in order to allow additional force to be applied at the heat sink/processor interface through springs, screws, and other fasteners.

The contact area and pressure between the heat sink and the electrical components are important considerations in heat sink design. A heat sink with a flat contact area is preferred since a thinner layer of thermal compound may be used. This reduces the thermal resistance between the heat sink and the heat source. The pressure between the heat sink and the heat source is typically high in order to maintain the requisite thermal contact and to facilitate thermal flow. Simple mechanical clips may help maintain the requisite pressure between the surface of the heat sink and the processor, but such clips are usually difficult to install and are not reliable when the computer is being shipped. Jarring that can occur during shipping has the potential to cause the weight of the heat sink to fall directly on the processor or circuit board causing significant damage.

The recent proliferation of Land Grid Array (LGA) sockets have created another problem that must be considered during heat sink design and particularly in the manner in which heat sinks or other cooling devices are attached to the socket/processor assembly. Current LGA socket designs frequently contain heat sinks as part of the assembly. The heat sink base is usually used as one of the loading plates in the assembly and is typically attached to a back-side stiffener using multiple screws or spring-loaded threaded fasteners. Even these simple attachment means can consume a significant portion of the effective heat sink volume, since the screws or spring-loaded fasteners protrude through the heat sink and can require removal or partial removal of some of the fin structure, thereby reducing its thermal efficiency. Furthermore, uneven application of pressure can leave gaps between the heat sink and the electrical component that can compromise the thermal effectiveness of the heat sink.

Therefore, there is a need for an apparatus and method that allows a heat sink to be mounted above a processor and to deliver a load commensurate with the required thermal flow characteristics of the heat sink. It would be desirably if the apparatus were tool-less to increase usability and decrease the chances of damaging a circuit board or processor when installing or removing a heat sink. It would also be desirable to have a retention module that holds the heat sink firmly in place without compromising the thermal effectiveness of the heat sink. It would be even further desirable to have a common retention module and heat sink that could be used with electrical components which have various heights and pressure requirements.

SUMMARY OF THE INVENTION

One embodiment of the present invention provides a heat sink retention module. The heat sink retention module comprises of a frame, first and second wire modules and a latch. The frame is sized to receive the base of a heat sink and is securable to a circuit board. First and second wire modules each include a pair of arm sections pivotally coupled to opposing sides of the frame about a transverse axis, a transverse handle section, and a spring clip formed adjacent to the pivoting end of each arm section. The transverse axis of the first wire module is longitudinally spaced apart from the transverse axis of the second wire module. When the wire modules are adducted and flexed, a generally downward force is applied to the heat sink base by spring clips that extend generally perpendicular to each arm section. The wire modules are kept in the adducted position by a latch selectively securable between the transverse handle sections of the first and second wire modules.

Another embodiment of the present invention provides a heat sink assembly. The heat sink assembly comprises a heat sink retention module and a heat sink having a base. Preferably, the heat sink base includes a notch in alignment with each pivotal coupling to facilitate positioning of the heat sink base into the retention module frame. A heat sink assembly may be used in association with any of a plurality of processors having different heights simply by changing the length of the latch.

Yet another embodiment of the invention provides a method of maintaining contact between a heat sink and a first electrical component in a computer while transmitting load away from the first electrical component. The method comprises affixing a heat sink retention module to a computer circuit board, wherein the heat sink retention module comprises a frame positioned over the first electrical component and sized to receive the heat sink. The heat sink is placed proximate to the electrical component such that the heat sink base fits within the frame of the heat sink retention module. First and second wire modules are adducted and flexed to secure the heat sink. Each wire module includes a pair of arm sections pivotally coupled to opposing sides of the frame about a transverse axis, a transverse handle section, and a spring clip formed adjacent the pivoting end of each arm section. The transverse axis of the first wire module is longitudinally spaced apart from the transverse axis of the second wire module. Each spring clip extends generally perpendicular to the arm section for applying a generally downward force on the heat sink base when the wire modules are adducted and flexed. Securing a first latch between the transverse handle sections of the first and second wire modules serves to keep the wire modules in the adducted position. Accordingly, the latch length allows a standard set of a frame and coupled wire modules to be used in association with an electrical component having a defined height and to apply a defined pressure.

DETAILED DESCRIPTION

Figure 1:
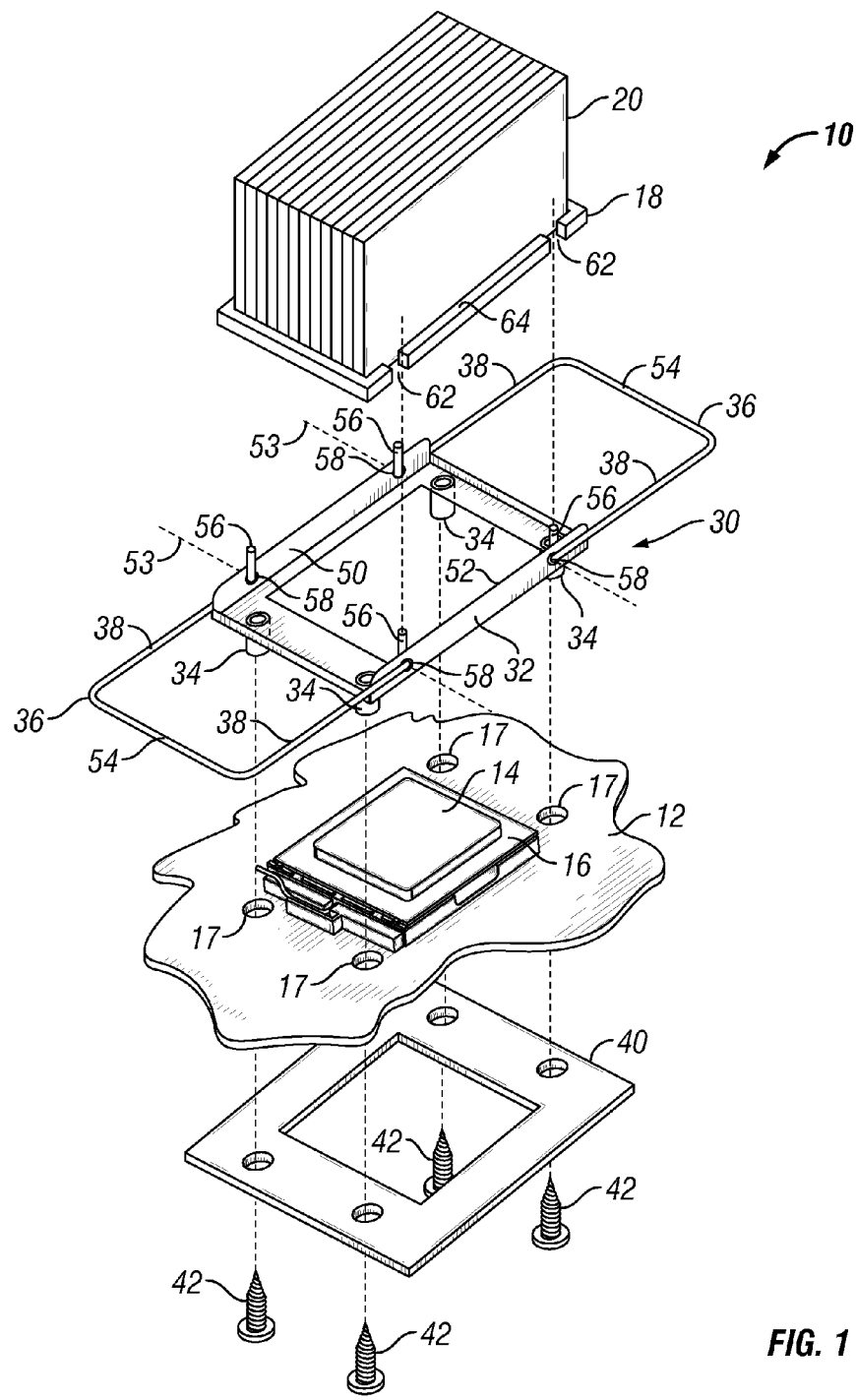
FIG. 1 is an exploded perspective view of a processor secured to a circuit board, a retention module securable to the circuit board, and a heat sink that may be retained by the retention module for thermal communication with the processor.

One embodiment of the present invention provides a heat sink retention module for securing a heat sink to a heat-generating electrical component, such as a processor on a circuit board. The heat sink retention module includes a frame sized to receive the base of a heat sink. The frame is securable to the circuit board, tray or chassis about the electrical component in any known manner in order to position the heat sink base in thermal communication with the electrical component. The frame preferably cooperates with the heat sink base to assure the proper orientation of the heat sink, such as the alignment of the heat sink fins with the direction of air flow across the electrical component. Accordingly, the frame may be sized, shaped or keyed to only accept the heat sink base in the proper orientation.

The heat sink retention module also includes first and second wire modules. Each of the wire modules includes a pair of arm sections pivotally coupled to opposing sides of the frame about a transverse axis, a transverse handle section, and a spring clip formed adjacent the pivoting end of each arm section. The transverse handle section connects the pair of arm sections and facilitates their simultaneous movement and latching. Preferably, the wire modules are dimensioned to clear the body of the heat sink when pivoting between the adducted position and an abducted position. The term "adducted position" means that the arm sections of the two wire modules have been brought closer together, and the term "abducted position" means that the arm sections of the two wire modules have been further separated apart.

Although the wire module may be made of various materials and in various configurations, the wire module is preferably a single, continuous metal wire that has been bent into the desired shape. Most preferably, the wire module has a transverse handle in the center, and each of the pair of arms is bent in the same direction to be substantially parallel. The ends of each arm are preferably bent transversely in order to form a pivot or "axle" that extends through the frame before being bent at a right angle to both the "axle" and the arms to form the spring clip. The spring clips on each wire module are generally parallel and both extend in the same direction to be downwardly actuated when the wire modules are adducted. The pivots or "axles" of each wire module are pivotally secured to the frame to define a transverse axis about which the wire module pivots. Accordingly, the transverse axis of the first wire module is longitudinally spaced apart from the transverse axis of the second wire module. Most preferably, the transverse axis of the first wire module and the transverse axis of the second wire module are equidistant from a transverse center line of the heat sink.

The heat sink retention module further includes a latch selectively securable between the transverse handle sections of the first and second wire modules to keep the wire modules in the adducted position. The latch may be made of various materials, such as metals and plastics, but will preferably not stretch so that the distance between the transverse handle sections can be fixed. Preferably, the latch may clip onto one or both transverse handle to prevent one end of the latch from slipping off while attempting to secure the other end. Optionally, the latch may be selectively securable to both of the transverse handles and removable for replacement with a latch having a different length. A particular advantage of the retention module of this embodiment is that the latch length can be selected or changed to allow a standard set of a frame and wire modules to be used in association with any of a plurality of processors having different heights.

The heat sink has a heat sink base that will be placed in thermal communication with the processor. Typically, the exposed face of the processor will be planar and the exposed face of the heat sink base will also be planar. This and other arrangements for full face-to-face contact provide good thermal communication between the two components. Thermal grease or other thermally conductive or thermally enhancing materials may be juxtaposed there between, but are not necessary. The heat sink base may include, without limitation, a solid metal or metal alloy plate, a thermally conductive composite, or a vapor chamber. The heat sink base also secures heat dissipating features, such as cooling fins, heat pipes and the like, that extend into an air flow passageway for cooling. In accordance with the invention, the heat sink base is selectively securable to the retention module for thermal communication of the heat sink with a processor. It is preferred that the heat sink base include a notch in alignment with each pivotal coupling of the wire module to the frame in order to simplify positioning of the base within the frame.

It should be recognized that embodiments of the invention may apply a uniform clamping force between the heat sink base and the processor when the heat sink is secured to the retention module. Using a wire module of known configuration and wire specification (i.e., material, gauge, dimensions), it is possible to empirically determine the length of latch that is necessary to apply a desired clamping force or pressure to any processor model even though different processors may have different heights. For example, a processor that is taller than another processor would generally require a longer latch to provide the same clamping force. Similarly, a processor that requires a greater clamping force than another processor of the same height would generally require a shorter latch. Accordingly, it is possible to determine the exact latch length that should be used with the retention module for a particular processor (i.e., know height and suggested pressure). It is a distinct advantage of the invention that the same frame, wire modules and heat sink may be utilized with various processors having a range of heights and suggested pressures. Optionally, a kit of latches having different lengths may be provided and utilized with various processors in accordance with an empirically determined table or list. Alternatively, the latch can be made with an adjustable length, such as by including, without limitation, a ratcheting portion, a turnbuckle, or a worm screw.

Another embodiment of the invention provides a heat sink assembly. The heat sink assembly comprises a heat sink retention module and a heat sink having a base. A heat sink assembly may be used in association with any of a plurality of processors having different heights simply by changing the length of the latch.

A further embodiment of the invention provides a method of maintaining contact between a heat sink and a first electrical component in a computer while transmitting load away from the first electrical component. The method includes affixing a heat sink retention module to a computer circuit board, tray or chassis, wherein the heat sink retention module comprises a frame positioned about the first electrical component and sized to receive the heat sink. The heat sink is placed proximate to the electrical component such that the heat sink base fits within the frame of the heat sink retention module. First and second wire modules are adducted and flexed resulting in the application of a generally downward force on the heat sink base. A latch is then secured between the transverse handle sections of the first and second wire modules to keep the wire modules in the adducted position.

FIG. 1 is an exploded perspective view of a heat sink assembly 10 securable to a circuit board 12 about a processor 14. The processor 14 is secured to the circuit board 12 via a socket 16 that also provides the processor with electrical communication with other components (not show) via the circuit board. An upper surface of the processor is generally flat and exposed for thermal communication with the flat base 18 of the heat sink 20.

The assembly 10 includes a retention module 30 securable to the circuit board 12, and a heat sink 20 that may be retained by the retention module for thermal communication with the processor 14. The retention module 30 includes a frame 32 that receives and positions the heat sink base 18. Securing the retention module 30 to the circuit board may be achieved using a back-side stiffener 40 positioned beneath the circuit board 12 and a plurality of fasteners 42 that extend through the back-side stiffener 40 and through a set of holes 17 in the circuit board 12 around the perimeter of the processor 14 and socket 16. The fasteners 42 may each engage and secure a post 34 of other feature of the retention module 30 that is secured to the frame 32.

The retention module 30 further includes first and second wire modules 36. Each of the wire modules 36 has a pair of arm sections 38 pivotally coupled to opposing sides 50, 52 of the frame 32 about a transverse axis 53, a transverse handle section 54, and a spring clip 56 formed adjacent the pivoting end of each arm section. The transverse handle section 54 connects the pair of arm sections 38 and facilitates their simultaneous movement and latching. Preferably, the wire modules 36 are dimensioned to clear the body of the heat sink when pivoting between the adducted position and an abducted position.

Wire module 36 is preferably a single, continuous metal wire that has been bent into the desired shape. The ends of each arm 38 are preferably bent transversely inward in order to form a pivot or "axle" 58 that extends through the frame 32 before being bent at a right angle to both the "axle" and the arms to form the spring clip 56. The pair of spring clips on each wire module is generally parallel to each other and both extend in the same direction to be downwardly actuated when the wire modules are adducted. The pivots or "axles" 58 of each wire module are pivotally secured to the frame, such as by extending through holes in the frame, to define the transverse axis 53 about which the wire module 36 pivots. Accordingly, the transverse axis 53 of a first wire module is longitudinally spaced apart from the transverse axis 53 of a second wire module. Most preferably, the transverse axis of the first wire module and the transverse axis of the second wire module are equidistant from a transverse center line 60 of the heat sink retention module 30.

Figure 2:
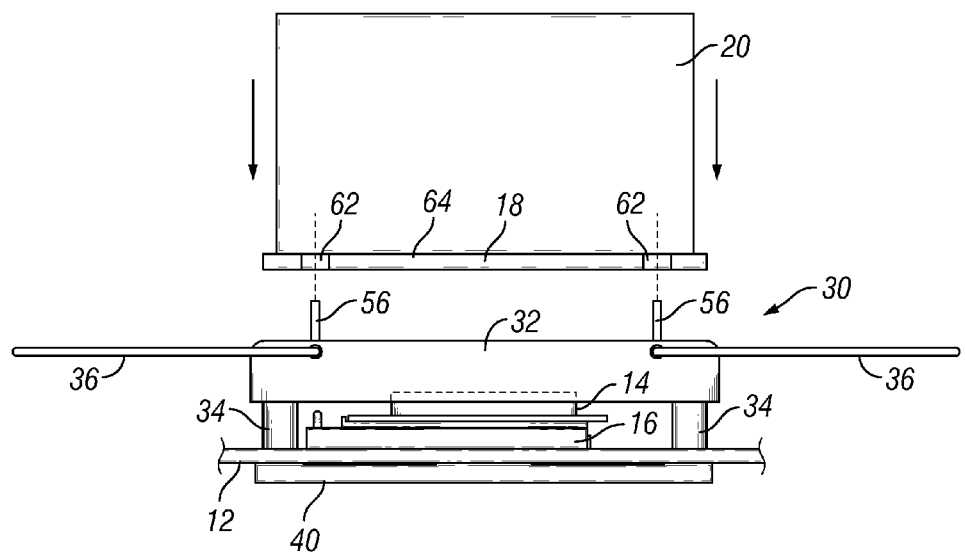
FIG. 2 is a side view of the retention module secured to the circuit board about the processor and prepared to receive the heat sink.

FIG. 2 is a side view of the retention module 30 secured to the circuit board 12 about the processor 14 and prepared to receive the heat sink 20. The heat sink 20 is aligned above the frame 32 with the heat sink base 18 directed toward the top of the processor 14. Each of the wire modules 36 has their arms 38 in an abducted (fully apart and open) position for receiving the heat sink base 18. The heat sink base 18 has a pair of notches 62 formed in a shoulder 64 along the edge of the base. (See also FIG. 1). Each notch 62 is aligned with a spring clip 56 so that the notch passes around the spring clip as the base 18 is lowered into the frame 32. It should be recognized that the base 18 does not require a should around the perimeter of the base, so long as there is a shoulder inwardly proximate to each spring clip for engagement of the spring clip when retaining the heat sink.

Figure 3:
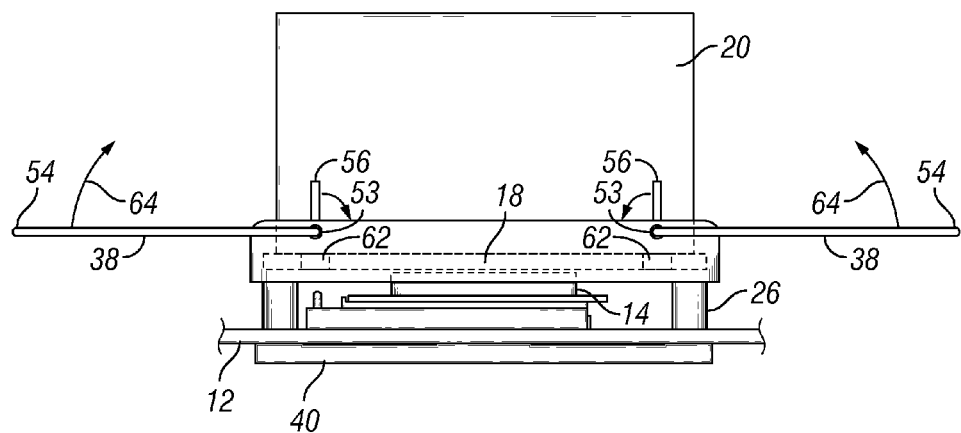
FIG. 3 is a side view of the retention module having received the heat sink.

FIG. 3 is a side view of the retention module 30 having received the heat sink 20. As shown, notches 62 have passed the spring clips 56 and the base 18 now rests squarely on the flat surface of the processor 14. Preferably, thermal grease has been applied between the base 18 and the processor 14 to improve thermal communication there between. Accordingly, the heat sink 20 is properly oriented with respect to the air flow over the processor and with respect to contact with the processor. Transverse handles 54 may now be lifted so that the arm sections 38 pivot about the transverse axis 53 in the direction of the arrows 64. The relative movement of the two wire modules may be referred to as "adducting" because the arm sections 38 of the modules are being brought closer together.

Figure 4:
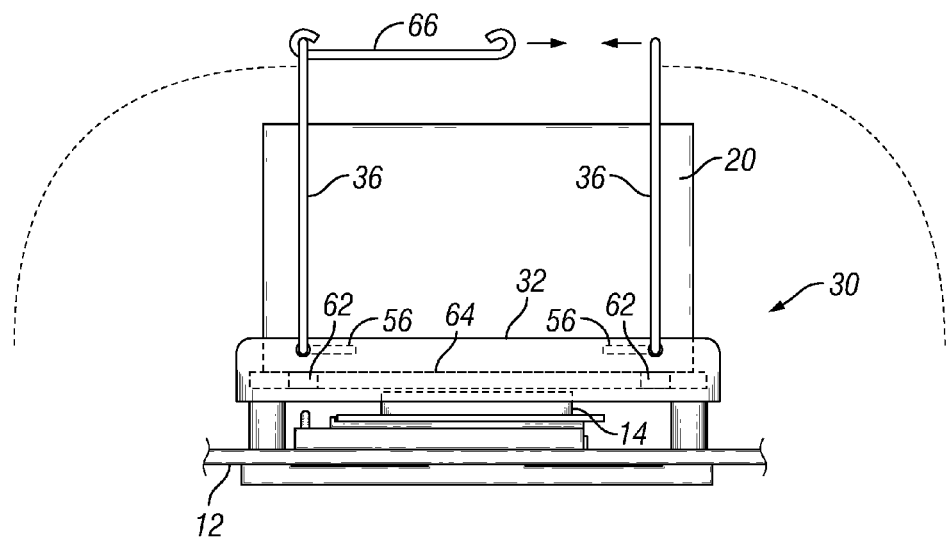
FIG. 4 is a side view of the retention module having secured the heat sink by adducting the wire modules.

FIG. 4 is a side view of the retention module 30 having secured the heat sink 20 by adducting the wire modules 36. Note that the spring clips 56 are now engaging the heat sink base 18 proximately inward of the notches 62. It should also be appreciated that after the springs clips 56 make contact with the base 18, any further adducting of the wire modules 36 will cause the wire modules 36 to flex and provide a downward clamping force of the spring clip 56 against the shoulder 64 of the heat sink base 18.

Figure 5:
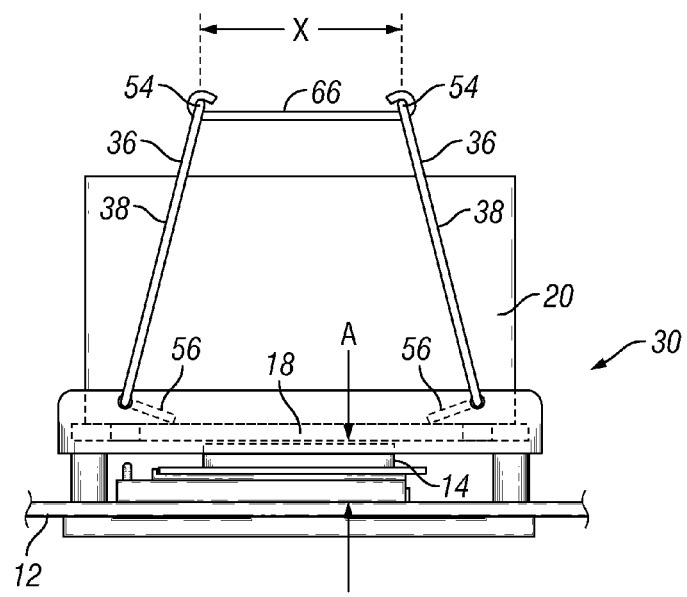
FIG. 5 is a side view of the retention module having secured the heat sink and coupling the wire modules together in an adducted position that presses the heat sink against the processor with a desired force.

FIG. 5 is a side view of the retention module 30 having secured the heat sink 20 and coupling the wire modules 36 together in an adducted and flexed position that presses the heat sink base 18 against the processor 14 with a desired force. The wire modules 36 may flex in the arm sections 38, the spring clips 56, the transverse handle 54, the axle 58, and any combination thereof, or throughout the entire wire module. However, the wire module 36 is made in a defined configuration with defined dimensions and made from a defined material. Accordingly, for any given processor height A and suggest pressure, the appropriate length X of a latch 66 can be empirically determined. While processor height may be measured from various benchmarks, the processor height A is shown as being measured as the distance above the surface of the circuit board 12. Alternatively, the processor height could be measured as the height of the processor above the lowest edge of the retention module frame.

Figure 6:
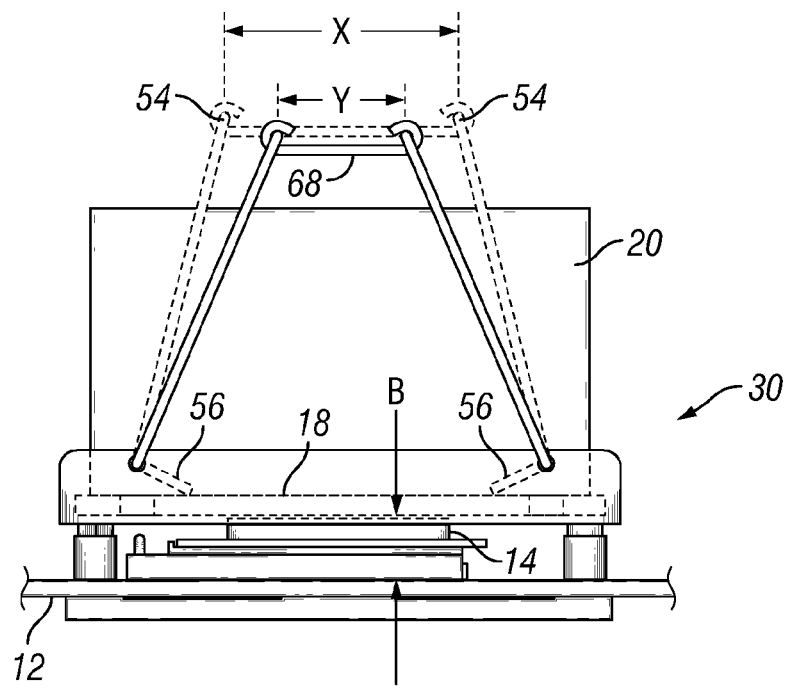
FIG. 6 is a side view of the retention module having secured the heat sink in accordance with FIG. 5, except that the processor height is shorter.

FIG. 6 is a side view of the retention module 30 having secured the heat sink 20 in accordance with FIG. 5, except that the processor height B is less than the processor height A of FIG. 5. Since the processor height B is less, the spring clips 56 pivot further before contacting the heat sink base 18, and the wire module must be adducted further to achieve the same pressure of the heat sink base 18 against the processor 14. Therefore, a latch 68 couples the transverse handles 54 and has a length Y that is less than length of the latch 66 of FIG. 5. It is a significant advantage of the present invention that only the length of the latch must be changed to allow the same retention module 30 and heat sink 20 configurations to be adapted for use with multiple processors having different heights.

It should be recognized that the range of processor heights that may be accommodated by the invention is variable and may be controlled by the length of the spring clip 56 and the positioning of the transverse axle 58 or transverse axis 53.

Figure 7A:
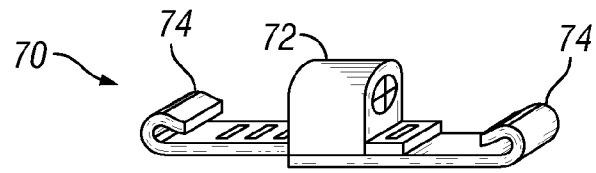
FIGS. 7A-7C are perspective views of adjustable length latches.
Figure 7B:
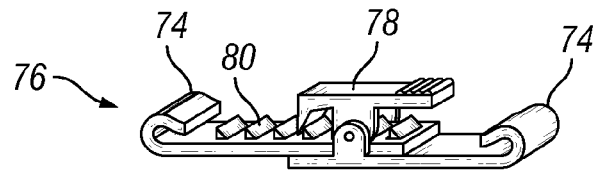
Figure 7C:
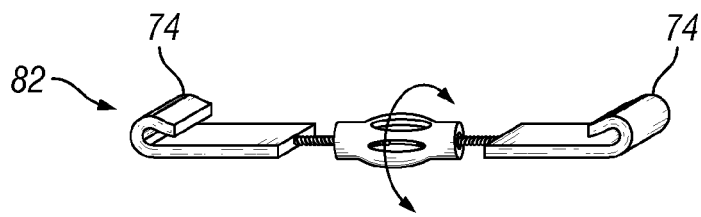

FIGS. 7A-7C are perspective views of adjustable length latches. In FIG. 7A, an adjustable length latch 70 includes a worm gear 72 between the opposing clasp ends 74 that is turned in one direction to move the ends together and turned in another direction to move the ends apart. In FIG. 7B, an adjustable length latch 76 includes a spring loaded ratchet 78 that selectively engages the notches or ridges 80 to secure the ends at a desired length. The spring loaded ratchet is opened to slide the ends to a desired length and closed to secure the ends from further separation. In FIG. 7C, an adjustable length latch 82 includes a turn buckle 28 that can be turned in one direction to drawing the ends 74 together and turned in another direction to push the ends 74 apart.

The terms "comprising," "including," and "having," as used in the claims and specification herein, shall be considered as indicating an open group that may include other elements not specified. The term "consisting essentially of," as used in the claims and specification herein, shall be considered as indicating a partially open group that may include other elements not specified, so long as those other elements do not materially alter the basic and novel characteristics of the claimed invention. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A heat sink retention module, comprising:
   a frame sized to receive a base of a heat sink; and
   first and second wire modules, each wire module including
      a pair of arm sections pivotally coupled to opposing sides of the frame about a transverse axis, a transverse handle section, and a spring clip formed adjacent a pivoting end of each arm section, wherein the transverse axis of the first wire module is longitudinally spaced apart from the transverse axis of the second wire module, and wherein each spring clip extends generally perpendicular to the respectively arm section for applying a generally downward force on the heat sink base when the wire modules are flexed in an adducted position; and
   a latch selectively securable between the transverse handle sections of the first and second wire modules to keep the wire modules in the adducted position.

2. The heat sink retention module of claim 1, wherein the heat sink base has a notch in alignment with each pivotal coupling.

3. The heat sink retention module of claim 1, wherein the first and second wire modules are dimensioned to clear the heat sink when pivoting between the adducted position and an abducted position.

4. The heat sink retention module of claim 1, wherein the transverse axis of the first wire module and the transverse axis of the second wire module are equidistant from a transverse center line of the heat sink.

5. The heat sink retention module of claim 1, characterized in that changing a length of the latch allows a standard set of a frame and wire modules to be used in association with any of a plurality of processors having different heights.

6. The heat sink retention module of claim 1, wherein the wire modules are composed of a metal wire.

7. A heat sink assembly, comprising:
   a heat sink having a base;
   a frame sized to receive the base of the heat sink; and
   first and second wire modules, each wire module including
      a pair of arm sections pivotally coupled to opposing sides of the frame about a transverse axis, a transverse handle section, and a spring clip formed adjacent pivoting end of each arm section, wherein the transverse axis of the first wire module is longitudinally spaced apart from the transverse axis of the second wire module, and wherein each spring clip extends generally perpendicular to the respectively arm section for applying a generally downward force on the heat sink base when the wire modules are flexed in an adducted position; and
   a latch selectively securable between the transverse handle sections of the first and second wire modules to keep the wire modules in the adducted position.

8. The heat sink assembly of claim 7, wherein the heat sink base has a notch in alignment with each pivotal coupling.

9. The heat sink assembly of claim 7, wherein the first and second wire modules are dimensioned to clear the heat sink when pivoting between the adducted position and an abducted position.

10. The heat sink assembly of claim 7, wherein the transverse axis of the first wire module and the transverse axis of the second wire module are equidistant from a transverse center line of the heat sink.

11. The heat sink assembly of claim 7, characterized in that changing a length of the latch allows a standard set of the frame and wire modules to be used in association with any of a plurality of processors having different heights.

12. The heat sink assembly of claim 7, wherein the wire modules are composed of a metal wire.

13. The heat sink assembly of claim 7, wherein the frame is affixed to a computer circuit board over an electrical component and positioned to secure the heat sink base in intimate contact with the electrical component.

14. A method of maintaining contact between a heat sink and a first electrical component in a computer while transmitting load away from the first electrical component, the method comprising:
   affixing a heat sink retention module to a computer circuit board, tray or chassis, wherein the heat sink retention module comprises a frame positioned over the first electrical component and sized to receive the heat sink;
   placing the heat sink proximate the electrical component such a base of that the heat sink base fits within the frame of the heat sink retention module;
   adducting and flexing first and second wire modules, each wire module including a pair of arm sections pivotally coupled to opposing sides of the frame about a transverse axis, a transverse handle section, and a spring clip formed adjacent a pivoting end of each arm section, wherein the transverse axis of the first wire module is longitudinally spaced apart from the transverse axis of the second wire module, and wherein each spring clip extends generally perpendicular to the respective arm section for applying a generally downward force on the heat sink base when the wire modules are flexed in an adducted position; and securing a first latch between the transverse handle sections of the first and second wire modules to keep the wire modules in the adducted position.

15. The method of claim 14, wherein the latch length allows a standard set of the frame and wire modules to be used in association with an electrical component having a defined height and to apply a defined pressure.

16. The method of claim 14, further comprising:

affixing an identical heat sink retention module with a frame positioned over a second electrical component, wherein the second electrical component has a different height than the first electrical component;

placing an identical heat sink proximate the second electrical component;

adducting and flexing identical first and second wire modules; and securing a second latch between the transverse handle sections of the identical first and second wire modules to keep the wire modules in the adducted position, wherein the second latch has a different length than the first latch to accommodate the difference in height of the second electrical component relative to the first electrical component.

* * * * *